United States Patent
Mori

(10) Patent No.: US 7,663,948 B2
(45) Date of Patent: Feb. 16, 2010

(54) DYNAMIC RANDOM ACCESS MEMORY (DRAM) FOR SUPPRESSING A SHORT-CIRCUIT CURRENT

(75) Inventor: Katsuhiro Mori, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 167 days.

(21) Appl. No.: 11/730,789

(22) Filed: Apr. 4, 2007

(65) Prior Publication Data
US 2008/0074939 A1 Mar. 27, 2008

(30) Foreign Application Priority Data
Sep. 26, 2006 (JP) ............... 2006-261170

(51) Int. Cl.
G11C 29/24 (2006.01)
G11C 7/12 (2006.01)
G11C 7/06 (2006.01)
G11C 7/08 (2006.01)

(52) U.S. Cl. .............. 365/200; 365/196; 365/203; 365/227; 714/710; 714/711

(58) Field of Classification Search ............... 365/200, 365/225.7, 196, 203, 227; 714/710, 711
See application file for complete search history.

(56) References Cited

U.S. PATENT DOCUMENTS 5,262,993 A * 11/1993 Horiguchi et al. .......... 365/200
5,673,231 A    9/1997 Furutani
5,896,334 A * 4/1999 Casper et al. ............... 365/202
6,144,599 A   11/2000 Akita et al.
6,850,454 B2 * 2/2005 Kuge et al. .................. 365/227
7,492,648 B2 * 2/2009 Sturm et al. ................. 365/195

FOREIGN PATENT DOCUMENTS

| JP | 4-342000 A | 11/1992 |
| JP | 9-69300 A | 3/1997 |
| JP | 11-149793 A | 6/1999 |

* cited by examiner

Primary Examiner—J. H. Hur
(74) Attorney, Agent, or Firm—Fujitsu Patent Center

(57) ABSTRACT

A semiconductor memory device which has a normal memory cell array and a redundant memory cell array for replacing a failure bit in the normal memory cell array, having: a memory cell array having a plurality of word lines, a plurality of bit line pairs crossing the word lines, and a plurality of memory cells placed at the crossing positions; and a plurality of sense amplifier circuits which are placed between adjacent memory cell arrays and are shared by bit line pairs of memory cell arrays on both sides. And a current interrupting circuit for disconnecting the sense amplifier and the bit line pairs in a column having a failure is formed respectively between the sense amplifier circuit and the bit line pairs on both sides. By this current interrupting circuit, short-circuit current from the sense amplifier circuit to the shorted area can be suppressed.

7 Claims, 7 Drawing Sheets

DYNAMIC RANDOM ACCESS MEMORY (DRAM) FOR SUPPRESSING A SHORT-CIRCUIT CURRENT

CROSS-REFERENCE TO RELATED APPLICATIONS

This application is based upon and claims the benefit of priority from the prior Japanese Patent Application No. 2006-261170, filed on Sep. 26, 2006, the entire contents of which are incorporated herein by reference.

BACKGROUND OF THE INVENTION

1. Field of the Invention

The present invention relates to a semiconductor memory device, and more particularly to a semiconductor memory device for suppressing a short-circuit current in a memory cell array where a cross failure, that is a short circuit of a world line and bit line, occurred.

2. Description of the Related Art

A semiconductor memory device, particularly a DRAM which has a large capacity, has a redundant cell array to avoid a drop in yield due to defective bits. A column or a row where a defective bit is detected in the operation test is replaced with a redundant cell array. As a result, a column or row having a defective bit is not selected.

One failure is the short-circuiting of a word line and bit line (cross failure). In a cell array having a cross failure, short-circuit current is generated in the standby state (precharge state) even if the cell array is not selected. In other words, in the standby status, all the word lines are driven to the L level (Vss or negative potential), and the bit lines are precharged to a precharge level, Vcc/2 or Vii/2 (Vii is an internal cell power supply). Therefore if a cross failure occurs in the precharge state, short-circuit current is generated from a bit line in the precharge state to a word line in L level.

Japanese Patent Application Laid-Open No. H9-69300 states that in order to prevent short-circuit current due to a cross failure, a transistor is formed between a precharge circuit and a precharge power supply for supplying precharge voltage to a pair of bit lines, and this transistor is controlled to the OFF state in a failure column so as to prevent the short-circuit current.

Japanese Patent Application Laid-open No. H11-149793 states that in order to prevent short-circuit current due to a cross failure, a transistor, as a current limiting element, is formed not only in a precharge power supply line of the precharge circuit of a bit line, but also in a precharge power supply line of a precharge circuit of a drive signal line for driving a sense amplifier, and this current limiting element is set to OFF by a column select signal. According to this patent document, a transistor for current limiting is created in a precharge circuit of a drive signal line of a sense amplifier, which is commonly formed for a plurality of bit line pairs.

Also Japanese Patent Application Laid-Open No. H4-34200 states that the control signal of a load circuit of a failure bit line is set to L level so that the load current does not flow in the SRAM. In this patent document, however, the prevention of a short-circuit current due to the cross failure of a DRAM is not stated.

According to Japanese Patent Application Laid-Open No. H11-149793, a transistor for interrupting the short-circuit current is formed between a precharge circuit of a bit line pair and a precharge power supply, and also a transistor for interrupting the short-circuit current is formed between a precharge circuit of a sense amplifier drive signal line and a precharge power supply.

SUMMARY OF THE INVENTION

However in order to replace a failure column with a redundant column in the unit of the bit line pair which has a failure, a transistor for interrupting a short-circuit current must be formed for each sense amplifier of the bit line pair. In this case, the interrupting transistors are comprised of a pair of transistors of NMOS and PMOS. Therefore in order to control these pair transistors to the OFF state, two types of interruption control signals having opposite phases must be supplied, which increases the area in the memory cell region.

With the foregoing in view, it is an object of the present invention to provide a semiconductor memory device which can interrupt short-circuit current for each bit line pair, using less number of control signals for the interruption.

To achieve the above object, a first aspect of the present invention provides a semiconductor memory device which has a normal memory cell array and a redundant memory cell array for replacing a failure bit in the normal memory cell array, having: a memory cell array having a plurality of word lines, a plurality of bit line pairs crossing the word lines, and a plurality of memory cells placed at the crossing positions; and a plurality of sense amplifier circuits which are placed between adjacent memory cell arrays and are shared by bit line pairs of memory cell arrays on both sides. And a current interrupting circuit for disconnecting the sense amplifier and the bit line pairs in a column having a failure is formed respectively between the sense amplifier circuit and the bit line pairs on both sides. By this current interrupting circuit, short-circuit current which flows from the precharge potential of the sense amplifier circuit to the shorted area of the bit line and the word line can be suppressed.

It is preferable that the first aspect of the present invention further has a precharge circuit for precharging a bit line in the memory cell array, and a precharge interrupting circuit which is formed between a precharge power supply line of the precharge circuit and a bit line, and is set to an interrupting state in a failure column. The current interrupting circuit and the precharge interrupting circuit are controlled to the interrupting state by one interruption control signal line formed for each one or plurality of bit line pairs.

In the first aspect, it is preferable that a precharge circuit for precharging a bit line is formed on the sense amplifier circuit side of the current interrupting circuit. If this configuration is used, short-circuit current from the sense amplifier circuit and the precharge circuit is suppressed by the current interrupting circuit.

To achieve the above object, a second aspect of the present invention is a semiconductor memory device which has a normal memory cell array and a redundant memory cell array for replacing a failure bit in the normal memory cell array, having: a memory cell array which has a plurality of word lines, a plurality of bit line pairs crossing the word lines, and a plurality of memory cells placed at the crossing positions; and a plurality of sense amplifiers formed corresponding to each bit line pair of the memory cell array. And a current interrupting circuit for disconnecting the sense amplifier circuit and the bit line pair in a failure column is formed between the sense amplifier circuit and the corresponding bit line pair respectively. By this current interrupting circuit, short-circuit current which flows from the precharge potential of the sense amplifier circuit to the shorted area of the bit line and the word line can be suppressed.

It is preferable that the second aspect further has a precharge circuit for precharging a bit line, and a precharge interrupting circuit, which is set to an interrupting state in a failure column, is formed between a precharge power supply line of the precharge circuit and a bit line. And the current interrupting circuit and the precharge interrupting circuit are controlled to the interrupting state by one interruption control signal line formed for each one or plurality of bit line pairs.

In the second aspect, it is preferable that the precharge circuit for precharging a bit line is placed on the sense amplifier circuit side of the current interrupting circuit. If this configuration is used, short-circuit current from the sense amplifier circuit and the precharge circuit is suppressed by the current interrupting circuit.

According to the present invention, in a column in which a failure is detected and which is replaced with a redundant memory cell array, the short-circuit current which flows from the sense amplifier circuit to the cross failure can be suppressed by setting the current interrupting circuit formed between the sense amplifier circuit and the memory cell array to an interrupting state. Also the current interrupting circuit and the precharge interrupting circuit can be set to the interrupting state using a common interruption control signal line.

DESCRIPTION OF THE PREFERRED EMBODIMENTS

Embodiments of the present invention will now be described with reference to the drawings. The technical scope of the present invention, however, is not limited to these embodiments, but shall include matters stated in the Claims and equivalents thereof.

Figure 1:
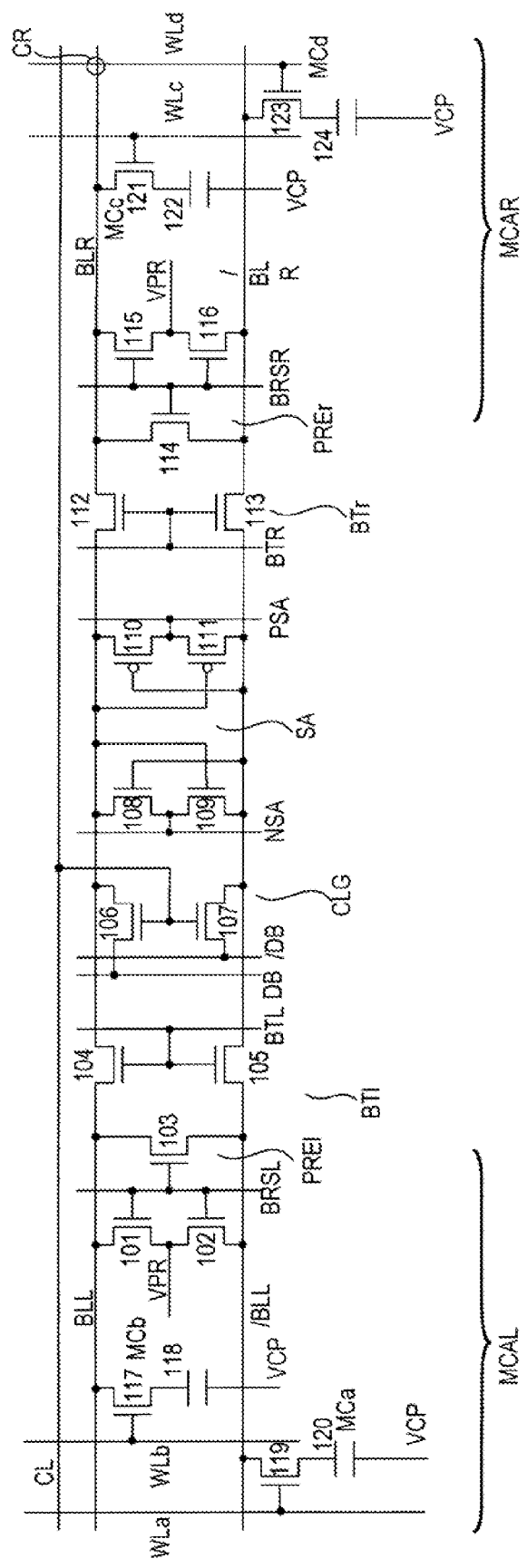
FIG. 1 is a circuit diagram of a general DRAM.
Figure 2:
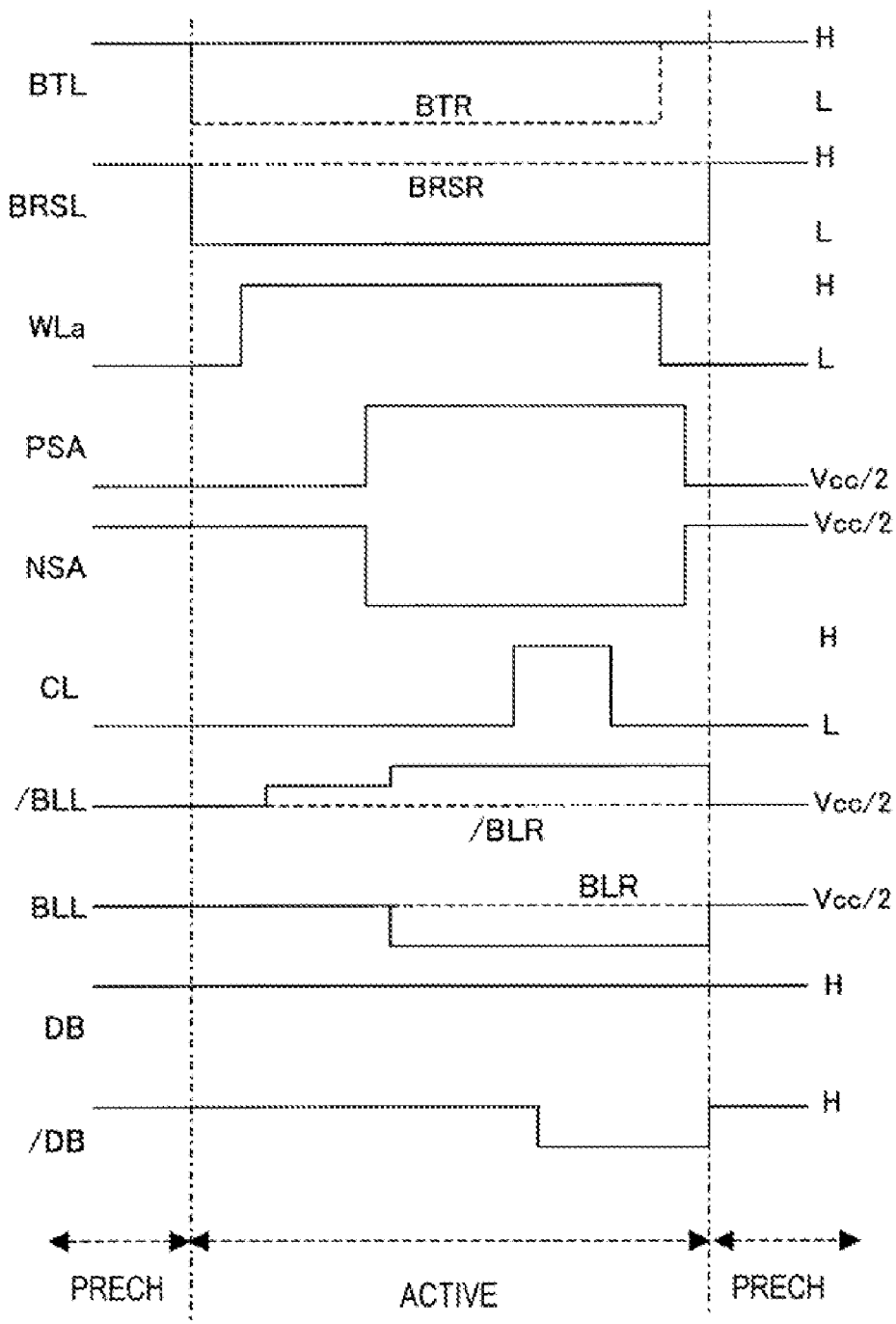
FIG. 2 is an operation waveform diagram of the DRAM in FIG. 1.

FIG. 1 is a circuit diagram of a general DRAM. And FIG. 2 is an operation waveform diagram thereof. The short-circuit current due to cross failure will now be described with reference to these drawings. FIG. 1 shows memory cell arrays MCAL and MCAR at the left and right, and a sense amplifier circuit SA formed there between. The memory cell arrays MCAL and MCAR have a plurality of bit line pairs BLL and /BLL, BLR and /BLR and a plurality of word lines WLa, WLb, WLc and WLd respectively, and have memory cells MCa, MCb, MCc and MCd at crossing positions thereof. In this way, the sense amplifier circuit SA formed at the center is shared by the bit line pairs of the memory cell arrays on both sides. In FIG. 1, only one bit line pair is shown in each memory cell array MCAL and MCAR respectively.

Each memory cell MCa, MCb, MCc and MCd has cell transistors 119, 117, 121 and 123, and cell capacitors 120, 118, 122 and 124 respectively, and a cell power supply VCP is connected to one electrode of the cell capacitor. The cell power supply VCP is either Vcc/2 of an external power supply Vcc or Vii/2 of an internal power supply Vii. The sense amplifier circuit SA is comprised of NMOS transistors 108 and 109 and PMOS transistors 110 and 111, and the gates of these transistors are connected to a corresponding bit line pair via bit line transfer circuits BTl and BTr, and sources are connected to sense amplifier signals NSA and PSA. The bit line transfer circuit is comprised of a pair of NMOS transistors 104, 105, 112 and 113 controlled by bit line transfer select signals BTL and BTR respectively.

A column gate CLG is formed adjacent to the sense amplifier circuit SA, and connects the bit line pairs to a data bus line pairs DB and /DB responding to a column select signal CL. The column gate CLG is comprised of a pair of NMOS transistors 106 and 107. In each of the memory cell arrays MCAL and MCAR, a precharge circuit PREl or PREr for charging the bit line pairs to a precharge level (Vcc/2 or Vii/2) is formed. The precharge circuit is comprised of a NMOS transistor 103 or 114 for short circuiting the bit line pairs and NMOS transistors 101 and 102, 115 and 116, for connecting the precharge power supply line VPR and the bit line pairs.

Now the operation of the DRAM in FIG. 1 will be described with reference to FIG. 2. It is assumed that the memory cell MCa in the memory cell array MCAL at the left is selected. First in the precharge state PRECH, both of the bit line transfer select signals BTL and BTR are at H level, both of the bit line transfer circuits BTl and BTr are in ON state, both of the bit line reset signals BRSL and BRSR are at H level, and both of the bit line pairs BLL and /BLL, BLR and /BLR have been precharged to precharge level VPR. All the word lines WL are set to L level, and the cell transistors of all the memory cells are in OFF state. Also both of the sense amplifier drive signals NSA and PSA are at precharge level, the sources and drains of the transistors 108 to 111 in the sense amplifier circuit are all at a same precharge level, and the sense amplifier circuit SA is in an inactive state.

Then in an active state (including active and read or write) ACTIVE, a bit line transfer select signal BTR at the non-selected side is driven to L level, the bit line transfer circuit BTr is turned OFF, so that the bit line pair BLR and /BLR of the memory cell array MCAR at the right side is disconnected from the sense amplifier circuit SA. Then a bit line reset signal BRSL is driven to L level, and all the transistors of the precharge circuit PRE1 in the memory cell array MCA1 at the left are turned OFF. When a selected word line WLa is driven to the H level after this, the bit line /BLL rises or falls from the precharge level by a micro-voltage amount from the precharge level according to the memory state of the memory cell MCa. In the example in FIG. 2, the bit line BLL rises.

When the sense drive signal NSA is driven to L level and PSA to H level respectively in this state, the sense amplifier circuit SA is activated, and the bit lines /BLL and BLL are driven to H level and L level respectively. When the column select signal CL becomes H level responding to the read command, the transistors 106 and 107 of the column gate CLG turn ON, and the H and L levels of the bit line pair /BLL and BLL are output to the data bus line pair DB and /DB. Now the active state completes.

To transit to the precharge state PRECH again, the select word line WLa becomes L level, the sense amplifier drive signals NSA and PSA return to the precharge level, and the sense amplifier circuit SA becomes inactive state. And the bit line reset signal BRSL is set to H level, the precharge circuit PRE1 is activated, and the bit line pair BLL and /BLL become precharge level.

Now the short-circuit current due to cross failure will be described. In the precharge state, the bit line pair is maintained at the precharge potential. However if a cross failure CR, where the bit line BLR and the word line WLd are shorted, is formed, the bit line BLR is dropped from the precharge level to the L level by the word line WLd, which is in L level. Therefore the short-circuit current is generated in the precharge circuit PREr through the route of the precharge power supply VPR, transistor 115, and bit line BLR and word line WLd. This is the same for the precharge circuit PREl side. The sense amplifier circuit SA is in inactive state, but the NMOS transistor 108 of the sense amplifier circuit SA is turned ON by the drop to L level of the bit line BLR, and the short-circuit current is generated from the sense amplifier drive signal line NSA, which is maintained at the precharge level, through the route of the transistor 108, bit line BLR and the word line WLd. If the bit line /BLR and the word line WLd are shorted, the short-circuit current flows via the bit line /BLR, just like above.

Figure 3:
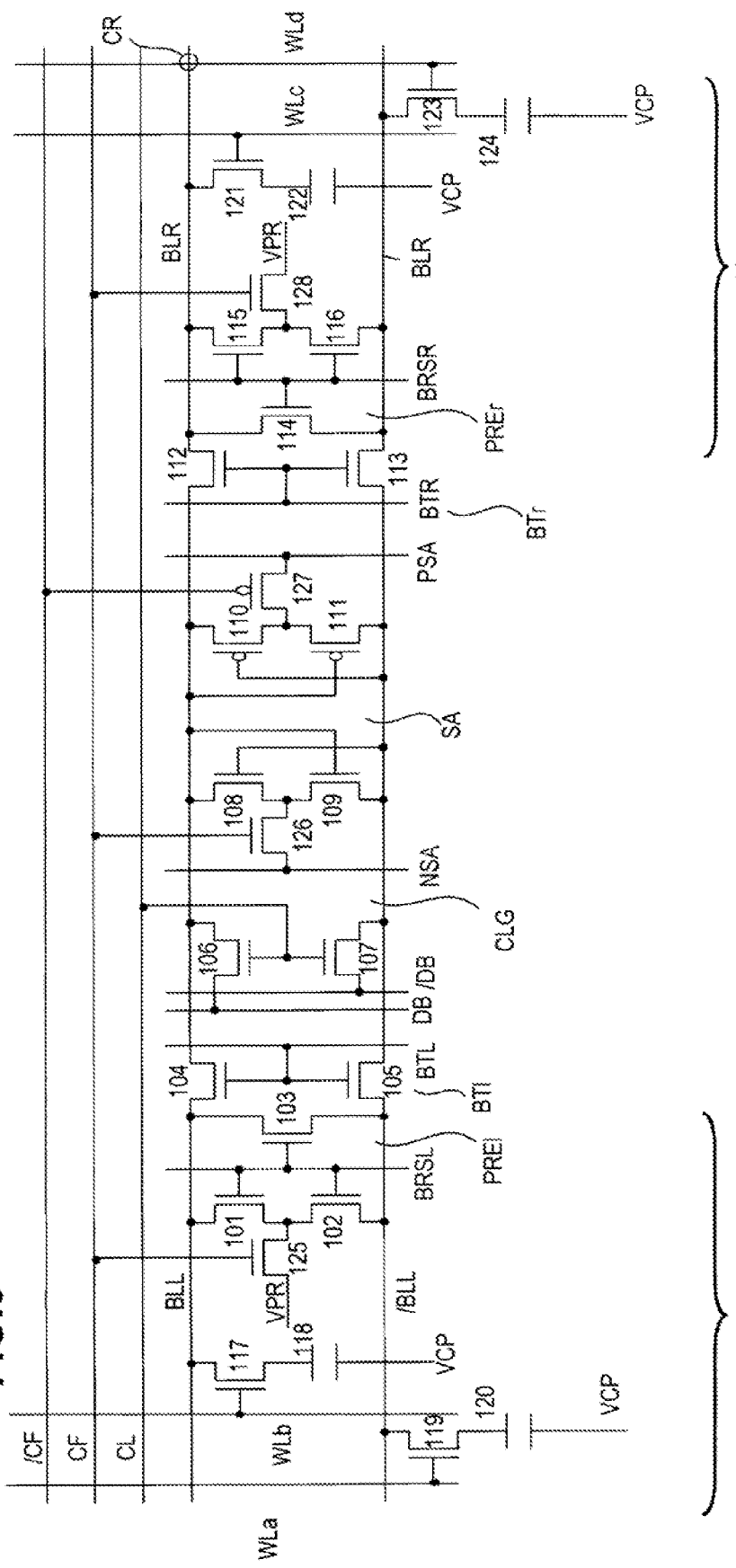
FIG. 3 is a circuit diagram of a DRAM preventing short-circuit current due to a cross failure.

FIG. 3 is a circuit diagram of a DRAM in which short-circuit current due to cross failure is prevented. This circuit is similar to the circuits disclosed in Japanese Patent Application Laid-Open No. H9-69300 and No. H11-149793. The reference numbers in FIG. 3 are the same as the reference numbers in FIG. 1. In the circuit of FIG. 3, NMOS transistors 125 and 128 for interrupting the short-circuit current are formed between precharge circuits PREl and PREr and a precharge power supply VPR respectively. In a column where a failure is detected, the transistors 125 or 128 is turned OFF responding to the L level of an interruption control signal line CF formed in each column. By this, short-circuit current from the precharge circuit PRE is suppressed.

Also in the circuit of FIG. 3, an NMOS transistor 126 is formed between the NMOS transistors 108 and 109 of a sense amplifier circuit SA and a sense amplifier drive signal NSA, and is turned OFF when an interruption control signal line CF becomes L level. Also a PMOS transistor 127 is formed between PMOS transistors 110 and 111 of the sense amplifier circuit and a sense amplifier drive signal PSA, and is turned OFF when an interruption control signal line /CF, having the opposite phase of CF, becomes H level. By forming these transistors 126 and 127, the short-circuit current from the sense amplifier circuit due to cross failure CR can be suppressed.

However the transistors 125, 126, 127 and 128 for interrupting the short-circuit current in FIG. 3, where NMOS transistors and PMOS transistors coexist, must be controlled by the interruption control signals CF and /CF having an opposite phase from each other. In other words, two interruption control signal lines CF and /CF must be formed for each column, which means that the area of the memory cell array increases. Also transistors for interrupting short-circuit current must be formed for the sense amplifier circuit and precharge circuit respectively.

Embodiments

Figure 4:
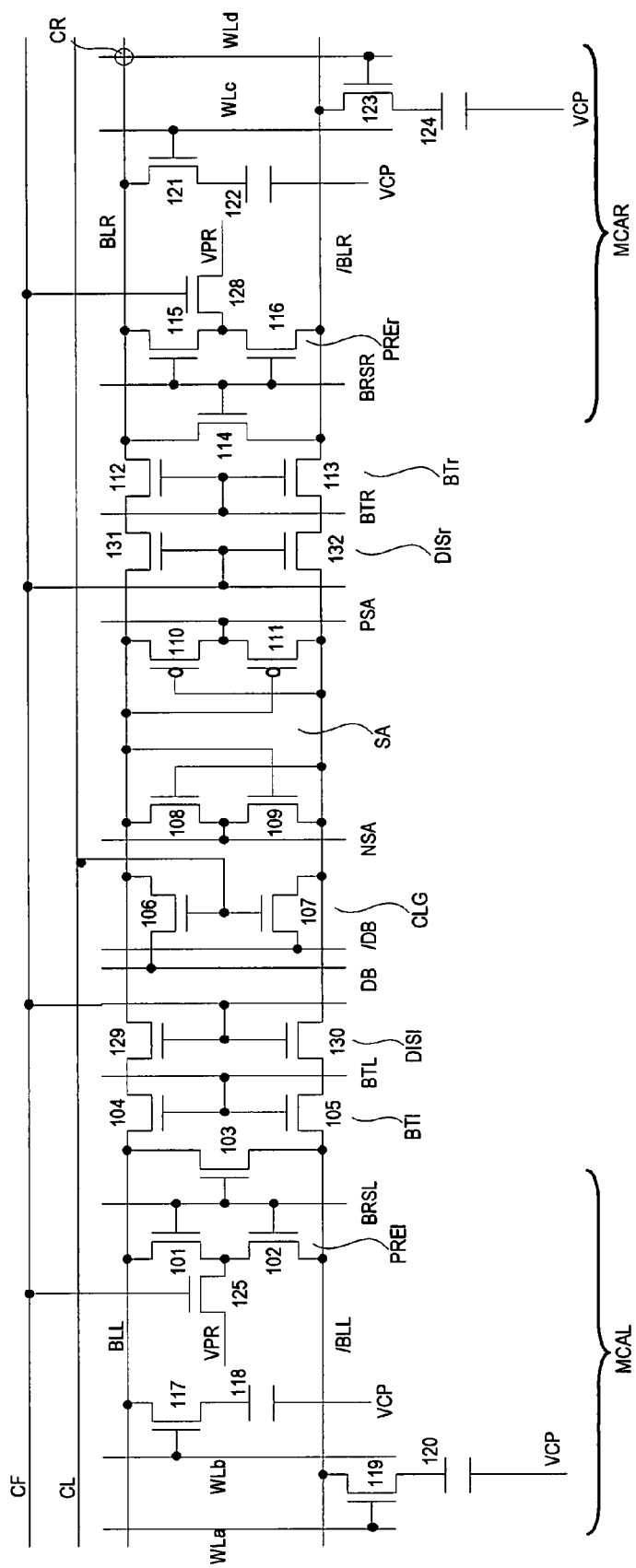
FIG. 4 is a circuit diagram of a DRAM according to the first embodiment.

FIG. 4 is a circuit diagram of a DRAM according to the first embodiment. The reference numbers in FIG. 4 are the same as those in FIG. 1. In the DRAM of FIG. 4, the different configuration from FIG. 1 includes short-circuit current interrupting circuits DISl and DISr formed between a sense amplifier circuit SA and memory cell arrays MCAL and MCAR on both sides thereof, NMOS transistors 125 and 128 as precharge interrupting circuits formed between precharge circuits PREl and PREr and precharge power supply VPR, and one line of interruption control signal CF for controlling the short-circuit current interrupting circuits DISl, DISr and the precharge interrupting circuits 125, 128 formed in each column.

In the DRAM of FIG. 4, the sense amplifier circuit SA is shared by the memory cell arrays MCAL and MCAR on both sides, and the precharge circuits PREl and PREr are positioned in the memory cell arrays MCAL and MCAR respectively. And the short-circuit current interrupting circuits DISl and DISr suppress the short-circuit current from the sense amplifier circuit SA to across failure.

The short-circuit current interrupting circuit DISl is comprised of NMOS transistors 129 and 130 formed between a bit line pair BLL and /BLL and the sense amplifier SA, and is turned OFF when the interruption control signal CF becomes L level. In the same way, the short-circuit current interrupting circuit DISr is comprised of NMOS transistors 131 and 132 formed between a bit line pair BLR and /BLR and the sense amplifier circuit SA, and is turned OFF when the interruption control signal CF becomes L level. The transistors 125 and 128 of the precharge interrupting circuit are also turned OFF when the interruption control signal CF becomes L level.

Therefore in a column in which a failure is detected and which is replaced with a redundant memory cell array, the interruption control signal CF is set to L level and short-circuit current is interrupted. Whereas in a column where a failure is not detected, the interruption control signal CF is set to H level.

Because of this, even if a bit line BLL and a word line WLd are shorted and a cross failure CR is generated, the interruption control signal CF of the column where the failure is detected is controlled to be L level, so the short-circuit current interrupting circuits DISl and DISr are turned OFF, and short-circuit current from the sense amplifier drive signals NSA and PSA of the sense amplifier circuit are interrupted. In the same way, the short-circuit current from the precharge power supply VPR of the precharge circuit is also interrupted because the transistors 125 and 128 of the precharge interrupting circuit are turned OFF.

The characteristic of the DRAM in FIG. 4 is that the transistors 125 and 128 of the precharge interrupting circuit and the transistors 129 to 132 of the short-circuit current interrupting circuits DISl and DISr are all NMOS transistors, so all of these transistors can be controlled to OFF state by setting one line of the interruption control signal CF to L level.

Figure 5:
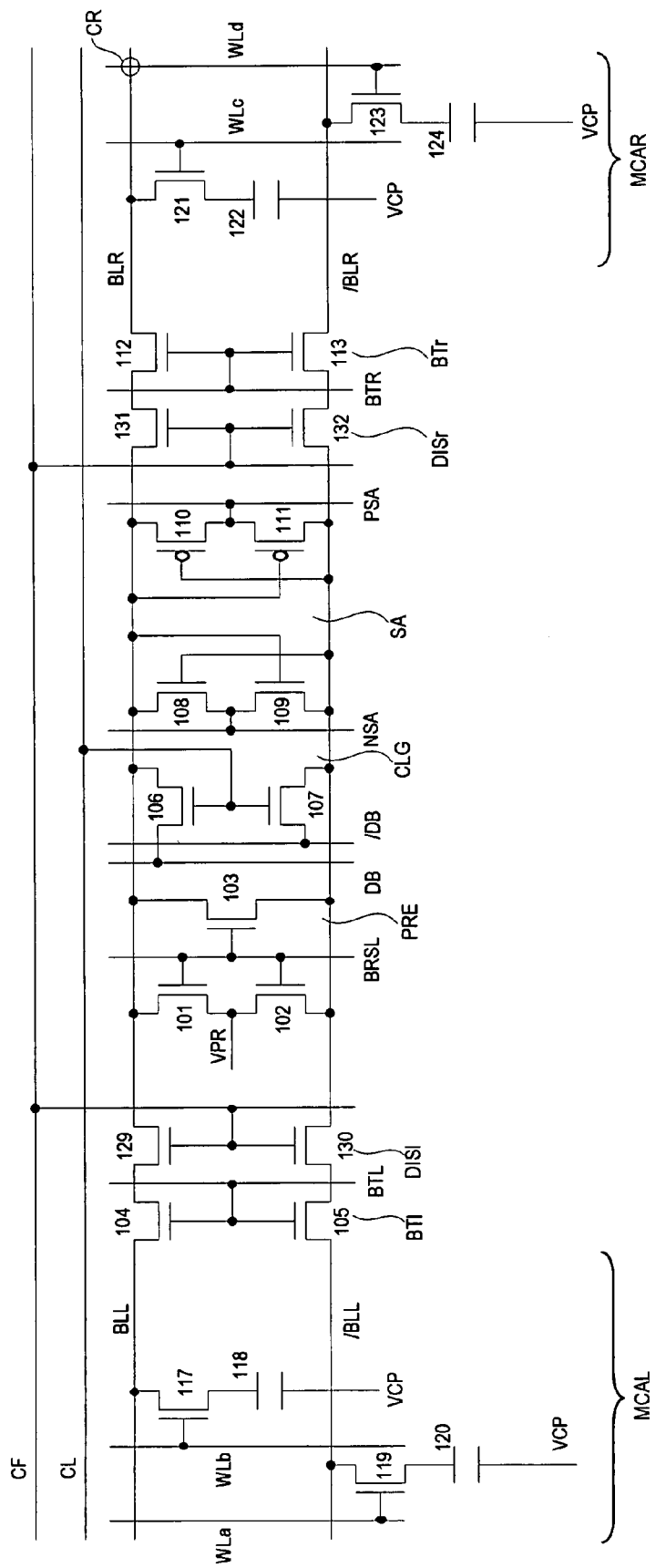
FIG. 5 is a circuit diagram of a DRAM according to a second embodiment.

FIG. 5 is a circuit diagram of a DRAM according to the second embodiment. In this DRAM, a sense amplifier circuit SA is shared by memory cell arrays MCAL and MCAR on both sides, and a bit line pair of a selected memory cell array is connected to the sense amplifier circuit SA by bit line transfer circuits BTl and BTr. A precharge circuit PRE is also formed between the bit line transfer circuits BTl and BTr, and is shared by the memory cell arrays MCAL and MCAR on both sides.

In this way, both the sense amplifier circuit SA and the precharge circuit PRE to be a cause of short-circuit current due to a cross failure CR are shared by the memory cell arrays MCAL and MCAR on both sides. Therefore short-circuit current interrupting circuits DISl and DISr are formed between these sense amplifier circuits SA and precharge circuit PRE and the memory cell arrays MCAL and MCAR, and a precharge interrupting circuit is not formed in the precharge circuit PRE. And NMOS transistors 129 to 132 constituting the short-circuit current interrupting circuits DISl and DISr are all turned OFF by the L level of one line of interruption control signal CF, so as to suppress the short-circuit current due to a cross failure.

In the second embodiment, short-circuit current due to a cross failure is prevented by forming the short-circuit current interrupting circuit DISl and DISr between the sense amplifier circuit SA and precharge circuit PRE and the memory cell arrays MCAL and MCAR. Therefore the number of transistors for suppressing short-circuit current can be decreased more than the first embodiment in FIG. 4.

Figure 6:
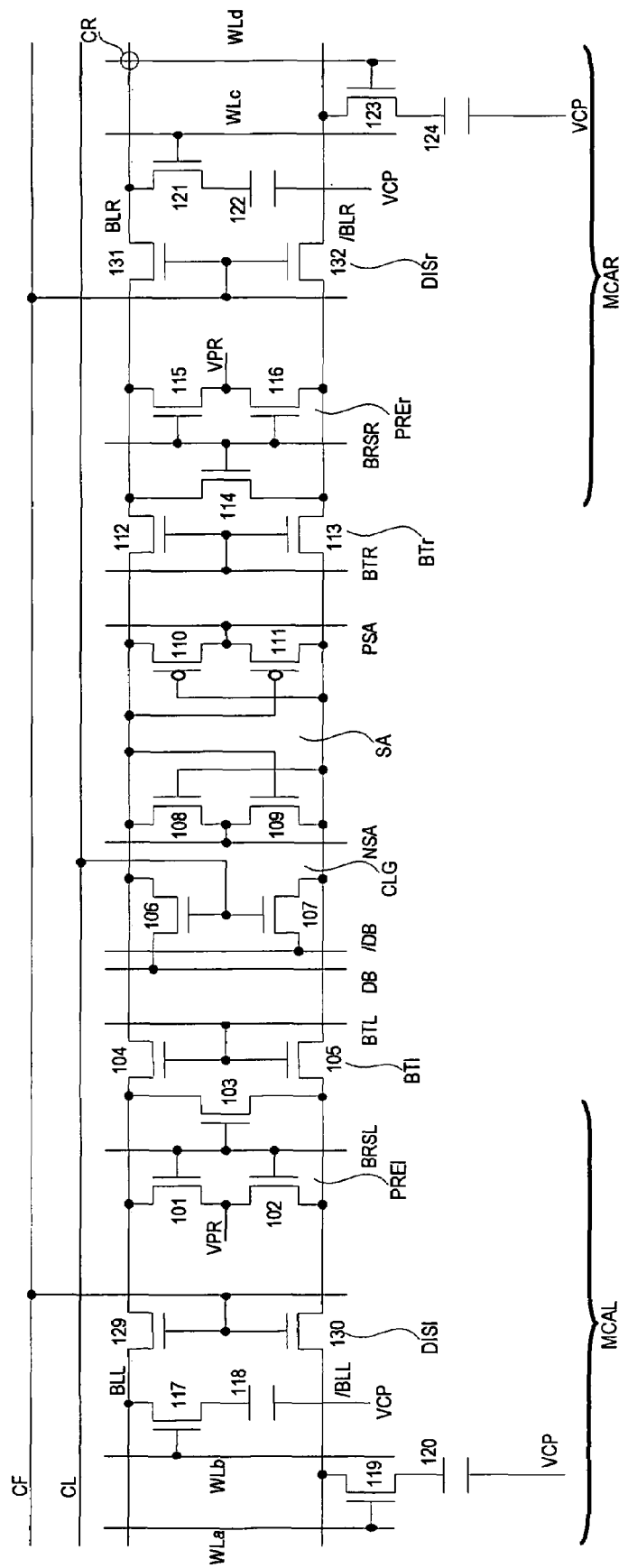
FIG. 6 is a circuit diagram of a DRAM according to a third embodiment.

FIG. 6 is a circuit diagram of a DRAM according to the third embodiment. In this DRAM, a sense amplifier circuit SA is shared by memory cell arrays MCAL and MCAR on both sides, and a bit line pair of a selected memory cell array is connected to the sense amplifier circuit SA via bit line transfer circuits BTl and BTr. Precharge circuits PREl and PREr, however, are formed on the memory cell arrays MCAL and MCAR on both sides respectively, and precharge bit line pairs BLL and /BLL, and BLR and /BLR, which correspond to the precharge circuit PREl and PREr respectively. Therefore the precharge operation becomes faster. This configuration is the same as the configuration in FIG. 1 and that of the first embodiment in FIG. 4.

Corresponding to the above configuration, according to the third embodiment shown in FIG. 6, short-circuit current interrupting circuits DISl and DISr are formed between the shared sense amplifier SA and two precharge circuits PREl and PREr and the memory cell arrays MCAL and MCAR on both sides. This short-circuit current interrupting circuit is comprised of NMOS transistors 129 to 132, and is turned OFF when one line of interruption control signal CF becomes L level, so as to suppress the short-circuit current. Therefore compared with the first embodiment shown in FIG. 4, it is unnecessary to form a transistor for the precharge interrupting circuit in the precharge circuits PREl and PREr in the case of the third embodiment.

In the first to third embodiments, the interruption control signal CF is set to H level in a column in which a failure was not detected, and is set to L level in a column in which a failure was detected and which is replaced with the redundant memory cell array. Therefore in a column which does not have a failure, both the short circuit current interrupting circuits DISl and DISr are maintained to be in ON state, and in a column to be replaced, the short circuit current interrupting circuits DISl and DISr are maintained to be in OFF state.

Figure 7:
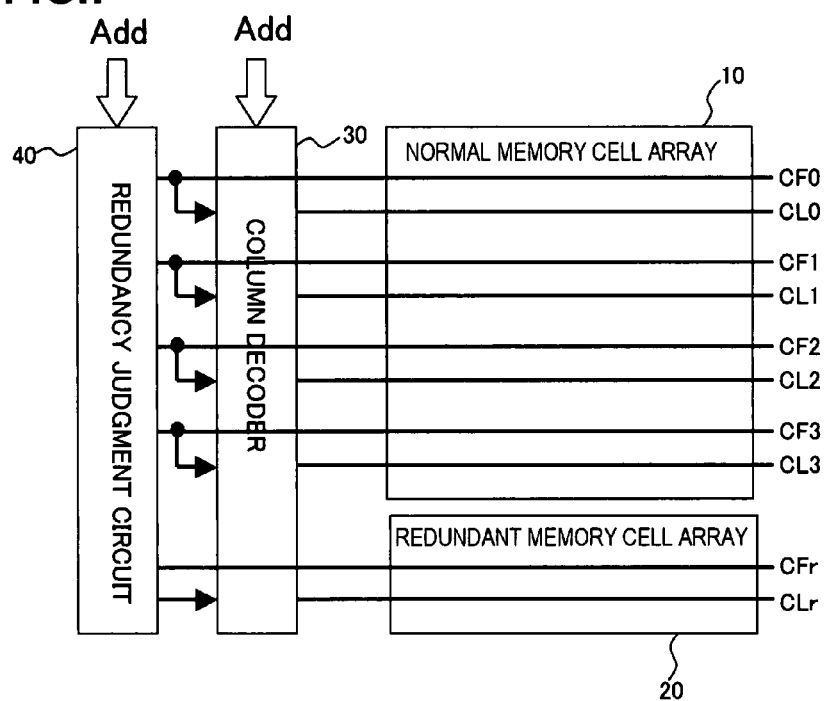
FIG. 7 is a diagram depicting a configuration of an interruption control signal according to the present embodiments.

FIG. 7 is a diagram depicting a configuration of an interruption control signal according to the present embodiments. The DRAM of the present embodiments is comprised of a normal memory call array 10 having a plurality of memory cells, and a redundant memory cell array 20 having a plurality of memory cells. And a column, in which a failure is detected in the normal memory cell array 10, is replaced with a column in the redundant memory cell array 20. A column decoder 30 decodes a column address Add and drives a column select signal CL for selecting a selected column to H level.

A redundancy judgment circuit 40, on the other hand, stores an address of a column replaced with the redundant memory cell array, compares a supplied column address Add and the stored address, and judges whether replacement with the redundant memory cell is necessary. This judgment result is supplied to the column decoder 30, and according to the judgment result, the column decoder 30 selects a column select signal CLr at the redundant memory cell array side, instead of a column select signal CL0 to 3 at the normal memory cell array side. Also the redundancy judgment circuit 40 sets the interruption control signals CF0 to 3 of the column corresponding to the stored address to L level, and maintains the transistors of the short-circuit current interrupting circuits DISl and DISr of the replacement target column and the precharge interrupting circuit to be OFF state. When replacement with the redundant memory cell array is executed, the redundancy judgment circuit 40 sets the interruption control signal CFr of the replacement target column in the redundant memory cell array to H level, and maintains the transistors of the short-circuit current interrupting circuits DISl and DISr and the precharge interrupting circuit of the column to be ON state. When a failure is detected in the redundant memory cell array, the redundancy judgment circuit 40 sets the interruption control signal CFr of the column to L level and maintains the transistors of the short-circuit current interrupting circuits DISl and DISr and the precharge interrupting circuit to be OFF state, in order to prevent short-circuit current due to a cross failure, even if replacement to the redundant memory call has not been executed. By this, the short-circuit current due to a cross failure in the redundant memory cell array can be suppressed.

As described above, according to the DRAM of the present embodiments, short-circuit current due to a cross failure can be suppressed by forming one line of an interruption control signal line in each column. Therefore an area of the memory cell array can be decreased.

In the above embodiments, a configuration of the memory cell arrays on both sides sharing the sense amplifier at the center was described as an example, but the present invention is not limited to this, and can also be applied to a configuration of not sharing the sense amplifier.

What is claimed is:

1. A semiconductor memory device, comprising:
   a memory cell array having a plurality of word lines, a plurality of bit line pairs crossing the word lines, and a plurality of memory cells placed at positions of the crossing;
   a redundant memory cell array for replacing a failure bit in the memory cell array;
   a plurality of sense amplifier circuits which are placed between adjacent memory cell arrays and are shared by a bit line pair of each column of the adjacent memory cell arrays on both sides;
   bit line transfer circuits formed between the sense amplifier circuit and the bit line pairs on both sides sharing the sense amplifier circuit respectively, each of which connects a selected bit line pair to the sense amplifier circuit; and
   current interrupting circuits formed between the sense amplifier circuit and the bit line pairs on both sides sharing the sense amplifier circuit respectively,
   wherein in a column replaced with a column in the redundant memory cell array, the current interrupting circuit in the column is set to an interrupting state.

2. The semiconductor memory device according to claim 1, further comprising:
   a precharge circuit which is formed in each bit line pair in the memory cell array and precharges the bit line pair to a precharge potential; and
   a precharge interrupting circuit formed between a precharge power supply line for supplying the precharge potential to the precharge circuit and a bit line pair,
   wherein in a column replaced with a column in the redundant memory cell array, the precharge interrupting circuit in the column is set to an interrupting state.

3. The semiconductor memory device according to any of claim 2, further comprising:
   one interruption control signal line which is formed for each one or plurality of bit line pairs and controls the current interrupting circuit and the precharge interrupting circuit; and
   a redundancy judgment circuit for detecting whether an accessed column address matches a failure address replaced with the redundant memory call array, wherein an interruption control signal is supplied to the interruption control signal line of a bit line pair corresponding to the failure address.

4. The semiconductor memory device according to claim 1, further comprising a precharge circuit which precharges a bit line pair between two current interrupting circuits which are respectively formed between the sense amplifier circuit and the bit line pair on both sides sharing the sense amplifier.

5. The semiconductor memory device according to claim 4, wherein the precharge circuit is formed between two bit line transfer circuits which are respectively formed between the sense amplifier circuit and bit line pairs on both sides sharing the sense amplifier, and is shared by the bit line pairs on both sides.

6. The semiconductor memory device according to claim 4, wherein the precharge circuit is respectively formed on the memory cell array side of the bit line transfer circuit.

7. The semiconductor memory device according to claim 1, further comprising:

one interruption control signal line which is formed for each one or plurality of bit line pairs and controls the current interrupting circuit; and a redundancy judgment circuit for detecting whether an accessed column address matches a failure address replaced with the redundant memory cell array, wherein an interruption control signal is supplied to the interruption control signal line of a bit line pair corresponding to the failure address.

* * * * *

UNITED STATES PATENT AND TRADEMARK OFFICE
CERTIFICATE OF CORRECTION

| | | |
|---|---|---|
| PATENT NO. | : 7,663,948 B2 | Page 1 of 1 |
| APPLICATION NO. | : 11/730789 | |
| DATED | : February 16, 2010 | |
| INVENTOR(S) | : Katsuhiro Mori | |

It is certified that error appears in the above-identified patent and that said Letters Patent is hereby corrected as shown below:

In the claims:

Column 8, line 59, claim 3 "any of claim 2" should read --claim 2--.

Signed and Sealed this
Twenty-sixth Day of April, 2011

David J. Kappos
*Director of the United States Patent and Trademark Office*